United States Patent [19]

Suzuki et al.

[11] Patent Number: 4,977,333
[45] Date of Patent: Dec. 11, 1990

[54] POWER SEMICONDUCTOR DEVICE INCLUDING AN ARRANGEMENT FOR CONTROLLING LOAD CURRENT BY INDEPENDENT CONTROL OF A PLURALITY OF SEMICONDUCTOR ELEMENTS

[75] Inventors: Masayoshi Suzuki, Hitachiota; Hidesato Horii, Katsuta, both of Japan

[73] Assignees: Hitachi, Ltd., Tokyo; Hitachi Automotive Engineering, Ltd., Ibaraki, both of Japan

[21] Appl. No.: 337,144

[22] Filed: Apr. 12, 1989

[30] Foreign Application Priority Data

Apr. 13, 1988 [JP] Japan .................................. 63-89082

[51] Int. Cl.$^5$ .......................................... H03K 17/12
[52] U.S. Cl. .................................... 307/243; 307/270; 307/577; 307/584; 307/254; 318/80; 377/2; 377/114
[58] Field of Search ............... 307/243, 264, 270, 254, 307/573, 575, 577, 584; 318/80; 377/2, 114

[56] References Cited

U.S. PATENT DOCUMENTS

| 4,532,443 | 7/1985 | Glennon | 307/270 X |
| 4,567,379 | 1/1986 | Corey et al. | 307/270 |
| 4,585,962 | 4/1986 | Sasayama | 307/270 X |
| 4,608,706 | 8/1986 | Chang et al. | 377/114 X |
| 4,609,832 | 9/1986 | Mehl | 307/243 X |
| 4,616,142 | 10/1986 | Upadhyay et al. | 307/254 X |
| 4,694,227 | 9/1987 | Doman | 318/80 |
| 4,707,620 | 11/1987 | Sullivan et al. | 307/270 |
| 4,719,369 | 1/1988 | Asano et al. | 307/451 X |

Primary Examiner—David Hudspeth
Attorney, Agent, or Firm—Antonelli, Terry, Stout & Kraus

[57] ABSTRACT

Semiconductor components electrically connected in parallel are divided into a plurality of groups, with the control terminals of the semiconductor components constituting each group being connected in common to form a control terminal of the group, wherein the control terminals of the groups are mutually independent. A load current is limited by allowing specified ones of said semiconductor components to become conductive. Control of the load current is made possible without accompanying wasteful power dissipation.

16 Claims, 7 Drawing Sheets

POWER SEMICONDUCTOR DEVICE INCLUDING AN ARRANGEMENT FOR CONTROLLING LOAD CURRENT BY INDEPENDENT CONTROL OF A PLURALITY OF SEMICONDUCTOR ELEMENTS

BACKGROUND OF THE INVENTION

This invention relates to a power semiconductor device, and more particularly to a power semiconductor device adopted to limit a current flowing through a load.

Generally, it is widely adopted for limiting a load current flowing through a power semiconductor device to control a voltage or a current applied to a control terminal of the semiconductor device. Here, however, the characteristic curve between the flowing load current and the control signal is non-linear such as a quadratic curve. Thus, it is difficult to control the current flowing through a semiconductor element only by a control signal applied to the control terminal thereof. Particularly, since the characteristic curve rises sharply at large load current values, it is very difficult to control the load current at a high precision. It is also adopted for controlling a load current flowing through a semiconductor element, to insert a resistor in series to the semiconductor element, detect the voltage drop appearing across the resistor and to adjust the control signal based on the voltage drop. In such a configuration, however, the power dissipation in the series resistor becomes large and generates much heat which is not favorable for the semiconductor device.

U.S. Pat. No. 4,553,084 proposes a metal-oxide-semiconductor (MOS) device having a plurality of current paths, wherein part of a load current flowing through part of the current paths is detected to control the total load current. In this MOS type power semiconductor device, a current detecting resistor is connected to part of thousands of circuit elements of the MOS semiconductor device, part of the load current is detected as the voltage drop across the afore-mentioned current detecting resistor, and the voltage signal applied to the gate terminal is controlled on the basis of the detected voltage drop. Whereby it is intended to minimize the power dissipation and to control the load current with a high precision.

Meanwhile, the so-called electronic controlling device are being digitalized in accompany with the development and spreading of the digital control devices such as micro-computers in these days. Therefore, it is strongly desired to provide a power semiconductor device easily controllable by the digital signal from these control devices.

In the above-mentioned power semiconductor device according to the prior art, however, part of a load current is forced to flow through a detecting resistor to detect the load current. Thus, there are generated unnecessary power dissipation and accompanying heat generation in the element itself. It is not always satisfactory for example for use under very severe conditions such as in automobiles. Also, it is not very suited for digitalization.

SUMMARY OF THE INVENTION

An object of this invention is to provide a power semiconductor device capable of limiting a load current without accompanying wasteful power dissipation.

Another object of this invention is to provide a power semiconductor device adapted for current control by a digital signal.

The above object of this invention is realized by a power semiconductor device characterized in that a plurality of semiconductor element components are formed on a same semiconductor substrate in electrically parallel relation, an input and an output terminal are provided respectively common to input and output terminals of said plurality of semiconductor element components, said plurality of semiconductor element components are divided into a plurality of groups, control terminals of semiconductor element components constituting each of these plurality of divided groups are connected in common and configured to be electrically independent from the rest of said control terminals corresponding to the rest groups of said plurality of semiconductor element component groups.

Another object of this invention is realized by a power semiconductor device characterized in that a plurality of semiconductor elements are electrically connected in parallel, an input and an output terminal are provided to respectively commonly connect input and output parts of these semiconductor elements, said plurality of semiconductor elements are divided into a plurality of groups, a plurality of control terminals are provided each commonly connecting control terminals of the semiconductor elements constituting one group, and counters are provided having output terminals connected to said plurality of control terminals.

According to the above-mentioned this invention, semiconductor components electrically connected in parallel are divided into a plurality of groups, with the control terminals of the semiconductor components constituting each group being connected in common to form a control terminal of the group, wherein the control terminals of the groups are mutually independent. A load current is limited by allowing specified ones of said semiconductor components to become conductive. Control of the load current is made possible without accompanying wasteful power dissipation.

Further, according to this invention, the control of said semiconductor component groups can be easily done with a counter. Such a structure can be simply constituted, and can be integrally formed on a same semiconductor substrate. Thus, it is advantageous also for scale-down. Further, it becomes possible to control a load current directly by digital signals.

DESCRIPTION OF THE PREFERRED EMBODIMENTS

Now, embodiments of this invention will be described hereinbelow.

Figure 1:
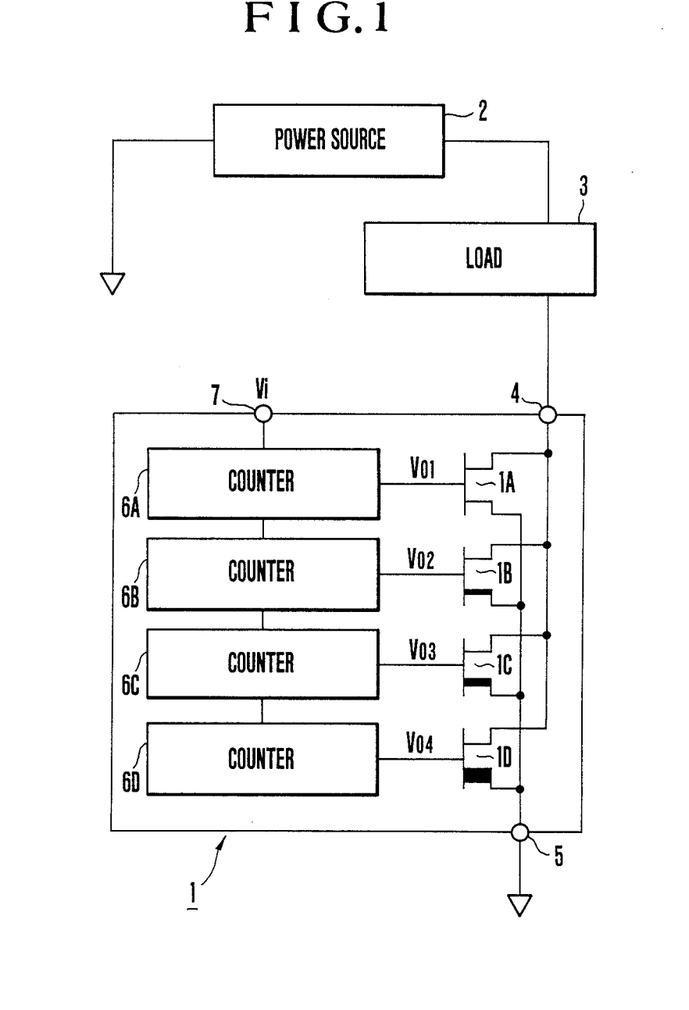
FIG. 1 is a schematic circuit diagram of power semiconductor device according to an embodiment of this invention.

FIG. 1 shows a power semiconductor device 1 including four MOS transistors, for example. In this figure, a part corresponding to a power source is shown at a reference numeral 2, which represents not only a voltage source such as a battery, but any voltage source regardless of ac or dc. A part corresponding to a load such as resistors is shown at a reference numeral 3, which represents not only a resistor, but any element or elements through which a current can pass through such as a coil or a capacitor. The semiconductor device 1 is connected in series to the load 3. This series connection is inserted between one terminal of the voltage source 2, the other terminal of which is grounded, and the ground potential.

Figure 2:
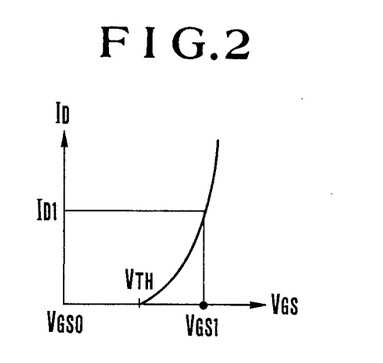
FIG. 2 is a graph showing a characteristic for explaining the operation of the semiconductor device of FIG. 1.

This semiconductor device 1 is formed of a plurality (exemplified as four in the figure) of MOS transistors 1A to 1D. The drains and the sources of these transistors are connected to common output terminals 4 and 5. That is, the transistors are connected in parallel. The respective gates of these MOS transistors 1A to 1D are arranged in dependent from one another and are applied with output signals $V_{01}$, $V_{02}$, $V_{03}$ and $V_{04}$ of the counters 6A to 6D which constitute the control circuit. More specifically, the output $V_{01}$ of the counter 6A is connected to the gate of the MOS transistor 1A, the output of the counter 6B is connected to the gate of the MOS transistor 1B, the output of the counter 6C is connected to the gate of the MOS transistor 1C, and the output of the counter 6D is connected to the gate of the MOS transistor 1D. Further, the counters 6A to 6D constituting the above-mentioned control circuit are so designed that the respective output voltages $V_{01}$ to $V_{04}$ can generate relatively precisely voltages $V_{GS0}$ below the threshold voltage $V_{TH}$ in the characteristic curve of the load current $I_D$ with respect to the control voltage $V_{GS}$ of the MOS transistor shown in FIG. 2 and the control voltage $V_{GS1}$. The counter 6A to 6D changes its output state, depending on an input signal $V_i$ inputted at a control input terminal 7 thereof.

The operation of the semiconductor device 1 will be described hereinbelow referring to FIG. 3. Along the time sequence of FIG. 3, all the counters 6A to 6D are cleared prior to time $t_1$ to have all zero "0" state.

Here, the four MOS transistors 1A to 1D of the semiconductor device 1 have mutually different current capacities. Letting the current capacity of the MOS transistor 1A responding to the control signal $V_{GS1}$ be $I_{1A}$, such arrangement is done that the current capacity $I_{1B}$ of the MOS transistor 1B is $I_{1B}=2^1 \times I_{LA}$, the current capacity $I_{1C}$ of the MOS transistor 1C is $I_{1C}=2^2 \times I_{1A}=4 \times I_{1A}$, and the current capacity $I_{1D}$ of the MOS transistor 1D is $I_{1D}=2^3 \times I_{1A}=8 \times I_{1A}$.

Figure 3:
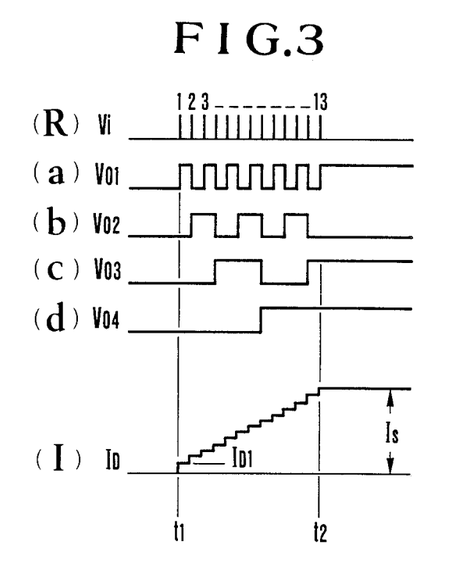
FIG. 3 is a waveform diagram showing waveforms at various parts of the semiconductor device of FIG. 1 for explaining the operation thereof.

At time $t_1$, a control input signal $V_1$ from a digital control device utilizing e.g. a micro-computer as shown in FIG. 3 (R) is inputted to the control input terminal 7 of the counter. In this example, there is shown a case of operation where 13 pulse signals are given from time $t_1$ to time $t_2$. Each time this pulse input signal $V_1$ is inputted to the input terminal 7, the output of the counter 6A changes from "0" level to "1" level by one pulse of the input signal $V_1$ as shown in FIG. 3(a). In response to input signals $V_i$ inputted thereafter, the counters 6A to 6D change their output state as shown in FIG. 3(a) to (d).

In response to the operation of the counters 6A to 6D, for example in response to the first pulse of the input signal $V_1$, the counter 6A changes its state, and the output $V_{01}$ take "1" levels as shown in FIG. 3(a). Then, the corresponding MOS transistors 1A are turned "on (conductive)", to allow a load current of a magnitude $I_{1A}$ to flow. Then, when the second pulse is inputted, the counter 6A changes again to return to "0" level, simultaneously with which the counter 6B consumes "1" level. At this time, the corresponding MOS transistor 1B becomes "on" state, while the MOS transistor 1A returns to "off" state. Thereby, a load current defined as $I_{1B}=2 \times I_{1A}$ is allowed to flow. When the third pulse is further inputted, the outputs of the counters 6A and 6B become "1" level to drive MOS transistors 1A and 1B to "on" state which allow a load current $I_{1A}+I_{1B}=I_{1A}+2I_{1A}$ $3I_{1A}$ to flow. Similar operations are repeated. When the thirteenth pulse is inputted, the counters 6A, 6C and 6D are at "1" level to drive the MOS transistors 1A, 1C and 1D into "on" state, thereby allowing a load current $I_{1A}+I_{1C}+I_{1D}=I_{1A}+4I_{1A}+8I_{1A}=13I_{1A}$ to flow through a load 3 inserted in series.

As is apparent from the above, it becomes possible that the power semiconductor device 1 controls the load current in accordance with the number of pulses of the input signal $V_i$ inputted to the control input terminal 7. In this embodiment, four MOS transistors 1A to 1D and four counters 6A to 6D are provided to enable setting of the load current at $2^4-1=15$ stages. It becomes possible to set the load current at $2^n-1$ stages by changing the parallel MOS transistors configuration and the series stage number of the counters.

As will be apparent from the explanation of the MOS type power semiconductor device according to an embodiment of this invention, the load current of the device can be controlled to a predetermined value without using any impedance means such as a resistor element connected to the drain or to the source. Thus, it becomes possible to minimize the wasteful heat generation. Also, the control of the magnitude of current can be easily done by digital signals to the counters.

Further, in the embodiment shown in FIG. 1, the current capacities of the MOS type transistors 1A to 1D are selected to be different from one another, more particularly selected to be successively twice as large as another, to enable selection of the load current at $2^n-1$ stages. Here, however, this arrangement is not limitative. It is possible to set all the current capacities of the MOS transistors 1A to 1D at the same value. In such a case, when the power semiconductor device is constituted of four MOS type transistor elements 1A to 1D as shown in FIG. 1, the total current is controlled at one of four levels. Also in such a case, the counters 6A to 6D are so designed to provide outputs on the output terminals thereof according to the magnitude of the digital signal.

Figure 4A:
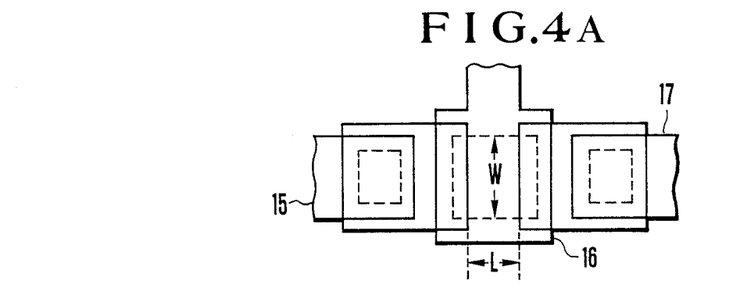
FIGS. 4A and 4B are a plan view and a cross-section of a structure which constitutes the semiconductor device of FIG. 1 with MOS type transistors.
Figure 4B:
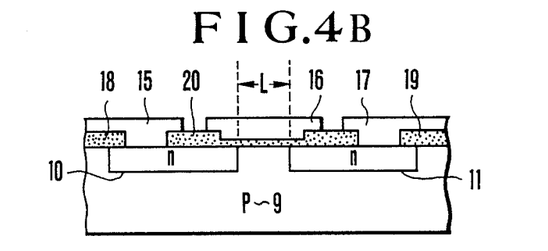

Further, in the embodiment of FIG. 1, MOS type transistors 1A to 1D are formed on a same semiconductor substrate in the form of a plurality of MOS type transistors 1A to 1D of different current capacities. Such a configuration can be realized in a device structure as shown in FIGS. 4A and 4B.

Namely, the drain current $I_D$ of a MOS element can usually be designed by the channel width and the channel length. In the structure, n type regions 10 and 11 are formed in a p type silicon substrate 9 by diffusion, insulating layers 18, 19 and 20 of silicon oxide are formed on the surface of these parts, and extracting portions 15, 16 and 17 (more specifically a drain electrode 15, a gate electrode 16, and a source electrode 17) are formed using a metal or polycrystalline silicon, etc. to constitute a MOS element. Letting the width of the channel between the above-mentioned two n type regions 10 and 11 be W and the length of the channel be L, the current capacity is proportional to W/L. Namely, by designing this ratio W/L to be twice, four times and eight times, the drain currents allowed to flow through the four MOS type transistors 1A to 1D can be set twice, four times and eight times. Also, when the channel width W is kept constant, it is possible to realize similar current capacities by setting the channel length L as $\frac{1}{2}$, $\frac{1}{4}$ and $\frac{1}{8}$.

Further, in the embodiment of FIG. 1, the counters 6A to 6D and the MOS type transistors 1A to 1D are formed on a same semiconductor substrate, which is advantageous for reducing the size of the device.

Figure 5:
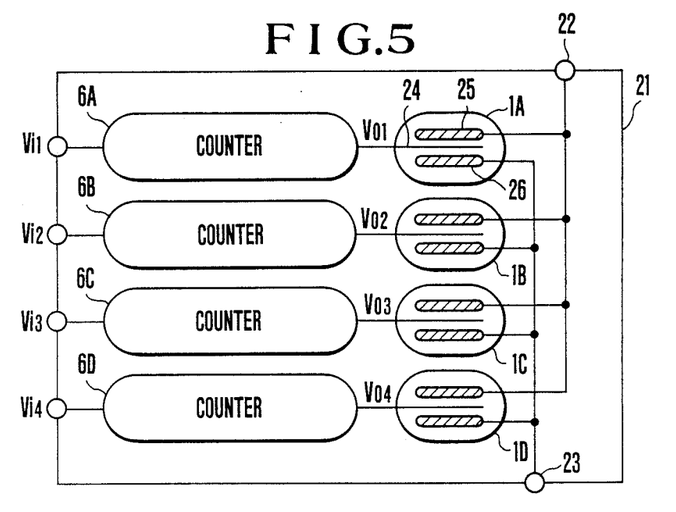
FIG. 5 is a diagram showing a model of a circuit construction in which the semiconductor device of FIG. 1 is integrated in a unitary body.

FIG. 5 schematically shows a circuit construction of an embodiment in which the semiconductor device is integrated in one body. In a chip 21, MOS elements 1A to 1D are integrated as in the structure of FIG. 4B, with the drains and the sources of the respective elements connected in parallel with internal wirings to provide terminals 22 and 23. In the chip, control circuits 6A to 6D are similarly integrated with interconnections to the MOS elements provided internally. In this embodiment, most of the circuit can be formed in one chip, to enable reduction of the dimensions of the circuit.

Although FIG. 5 shows an embodiment of a planar chip, the chip configuration may also be a multi-chip configuration or a three-dimensional configuration.

Figure 6:
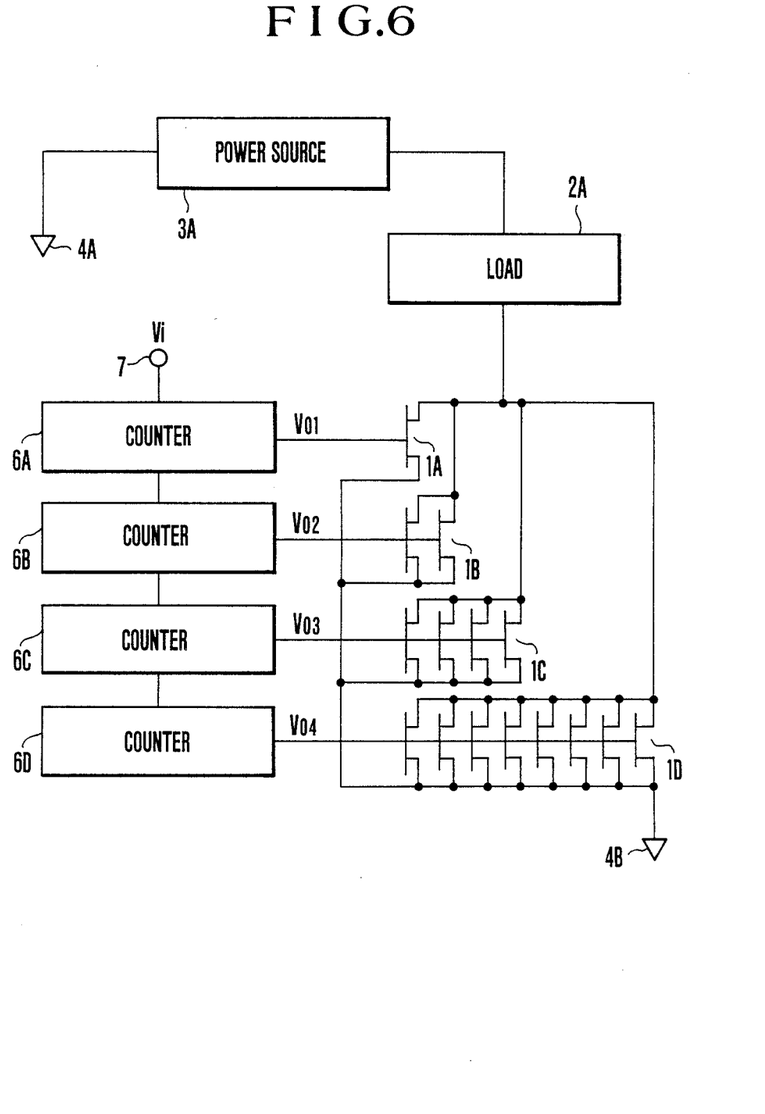
FIGS. 6 and 7 are circuit diagrams of power semiconductor devices according to other embodiments of this invention.

FIG. 6 shows a modification of the power semiconductor device of FIG. 1, in which counters are similarly used as a control circuit. With respect to the MOS transistors 1A to 1D, the lowest rank MOS transistor 1A is constituted of one MOS transistor element, the next lowest rank MOS transistor 1B is constituted of two MOS transistor elements, the third lowest rank MOS transistor 1C is constituted of $2^2=4$ MOS transistor elements, and the highest (fourth lowest) rank MOS transistor 1D is constituted of $2^3=8$ MOS transistor elements. In this embodiment, the load current can be set at one of 16 ($=2^4$) levels, similar to the embodiment of FIG. 1. Further, according to this embodiment, although there arises an inconvenience, compared to the embodiment of FIG. 1, that the interconnections, etc. increase, there is provided an advantage that various current capacities can be relatively easily set by using a plurality of MOS transistors.

Figure 7:
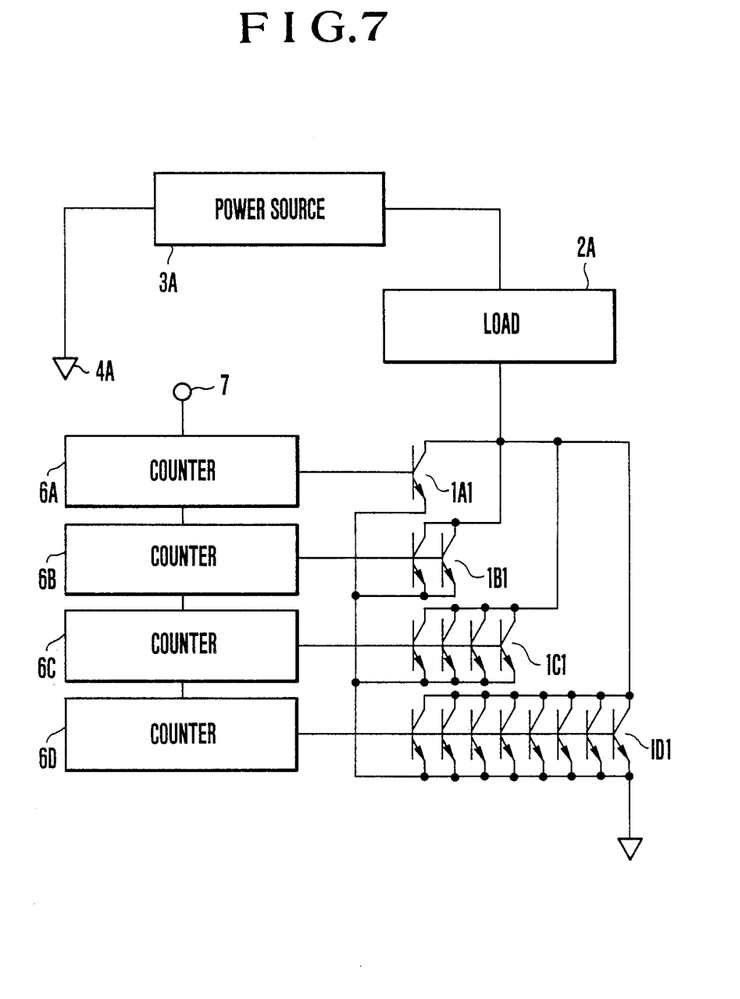

FIG. 7 shows an embodiment in which the MOS transistors of the semiconductor device of FIG. 6 are replaced with bipolar transistors. The device of this embodiment includes bipolar transistors 1A1 to 1D1 which are respectively formed of a predetermined number of bipolar transistor elements combined in parallel. The respective output signals of counters 6A to 6D are inputted to the corresponding bases of the transistors 1A1 to 1D1 to drive them respectively. Usually, the bipolar transistor, in particular the Darlington-connection bipolar transistor can readily provide a large current capacity compared to the MOS transistor. This embodiment thus has a feature that a large current can be set.

Figure 8:
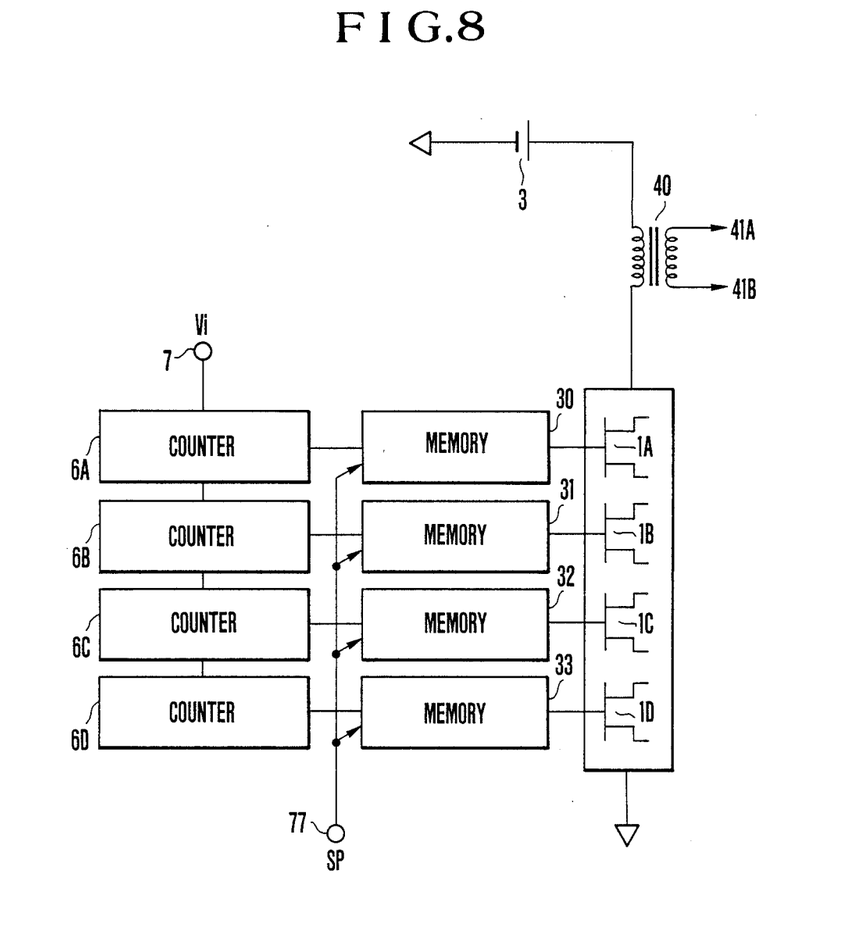
FIGS. 8 and 9 are circuit diagrams of specific control devices embodying power semiconductor devices according to embodiments of this invention.
Figure 9:
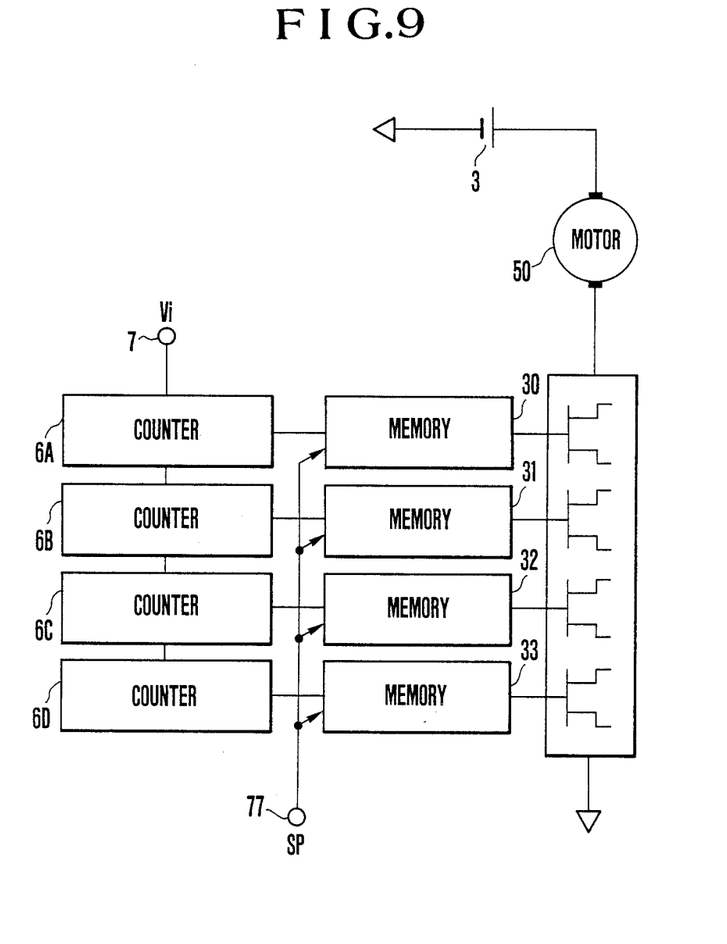

FIGS. 8 and 9 show examples wherein the power semiconductor device as explained above is employed in specific circuits. FIG. 8 shows a ignition system for an automobile and FIG. 9 shows a control circuit for a dc motor used, for example, as an actuator for controlling an automobile, etc.

First, the embodiment of FIG. 8 will be stated. Counters 6A to 6D and MOS transistor groups 1A to 1D are similar to those of the preceding embodiments, but the object to be controlled is a high voltage ignition coil 40 in an ignition circuit. Further, memories 30, 31, 32 and 33 are provided between the MOS transistor groups 1A to 1D and the counters 6A to 6D. These memories are provided with respective strobe inputs. Whereby when an external strobe pulse SP is applied to a strobe terminal 77, outputs corresponding to pulse inputs $V_i$ having been inputted to an input terminal 7 for the counters 6A to 6D are simultaneously applied to control terminals (i.e. gate terminals) of the MOS transistor groups 1A to 1D. Thereby, there arises no transient chronological changes in the content of the counters in this embodiment and the setting of the current level is immediately done for the load current to be controlled, without stepwise rising portion in the waveform of the current $I_D$ as shown in FIG. 3 (I). Further, generally in control of the ignition timing in an internal combustion engine, various parameters representing the rotation speed of the internal combustion engine, load conditions, etc. are taken in and processed in a microcomputer to determine the optimum ignition timing. In this case, the micro-computer also calculates, in addition to the ignition timing, the on-timing and the current level of the primary current required to generate a predetermined igniting high voltage on the secondary winding of the ignition coil 40. Such a calculated current level is inputted to the control input terminal 7 of the power control semiconductor device as a digital signal, to provide corresponding outputs from the counters 6A to 6D responding to the calculated value. Thereafter, upon the calculated on-timing, the microcomputer outputs a strobe pulse SP, thereby to apply the contents of the memories 30, 31, 32 and 33 to the gate terminals of the MOS transistor groups 1A to 1D. Thus, a predetermined combination of the MOS transistors is turned on to allow a current of a predetermined level to flow through the primary winding of the ignition coil 40. Thereafter, when the ignition timing comes, the gate signals for the MOS transistors are simultaneously taken off to drive the MOS transistors 1A to 1D non-conductive. Thus, the current having been allowed to flow through the primary winding of the ignition coil 40 is rapidly turned off. Simultaneously, a high voltage is generated in the secondary winding of the ignition coil 40 to generate igniting sparks at an ignition plug 41A and 41B.

Next, the control circuit for a dc motor will be explained. Similar to the case of FIG. 8, a power semiconductor device is connected in series to a dc motor 50 with respect to a power source 3. Thereby, the current allowed to flow through the dc motor is controlled, to perform the speed control.

As can be seen from the foregoing description, according to this invention, a load current can be controlled without accompanying power dissipation. Further, the device can be easily controlled with digital signals. Thus, an extremely useful power semiconductor device can be provided.

We claim:

1. A power semiconductor device comprising:
a plurality of semiconductor elements which are electrically connected in parallel;
an input and an output terminal for respectively commonly connecting input and outputs parts of these semiconductor elements, said plurality of semiconductor elements being divided into a plurality of groups;
a plurality of control terminals for each commonly connecting control terminals of the semiconductor elements forming one group; and
counters having output terminals connected to said plurality of control terminals, respectively, said counters including means for counting an input control pulse and outputting on said output terminals output signals in accordance with the counts thereof.

2. A power semiconductor device according to claim 1, wherein a current capacity of each of said plurality of groups of the semiconductor elements is given a predetermined weight with respect to the respective unit output from the output terminals of said counters.

3. A power semiconductor device according to claim 2, wherein the weights of said current capacities of said plurality of groups of the semiconductor elements are expressed in a relation $2^n$ where n is zero or a positive integer.

4. A power semiconductor device according to claim 1, wherein said plurality of semiconductor elements are formed on a same semiconductor substrate.

5. A power semiconductor device according to claim 4, wherein said counters are further formed on the same semiconductor substrate.

6. A power semiconductor device according to claim 1, wherein said semiconductor elements are formed of metal-oxide-semiconductor structures.

7. A power semiconductor device according to claim 5, wherein memory circuits are formed on said semiconductor substrate, and are inserted between the output terminals of said counter and said semiconductor elements.

8. A power semiconductor device according to claim 4, wherein said semiconductor elements are formed of metal-oxide-semiconductor structures.

9. A current controlling device for an ignition signal generating circuit for an internal combustion engine, wherein the current controlling device includes a power semiconductor device comprising:
a plurality of semiconductor elements which are electrically connected in parallel;
an input and an output terminal for respectively commonly connecting input and output parts of these semiconductor elements, said plurality of semiconductor elements being divided into a plurality of groups;
a plurality of control terminals for each commonly connecting control terminals of the semiconductor elements forming one group; and
counters having output terminals connected to said plurality of control terminals, respectively, said counters including means for counting an input control pulse and outputting on said output terminals output signals in accordance with the counts thereof.

10. A current controlling device according to claim 9, wherein said plurality of semiconductor elements are formed on a same semiconductor substrate.

11. A current controlling device according to claim 9, wherein said counters are further formed on the same semiconductor substrate.

12. A current controlling device according to claim 9, wherein memory circuits are formed on said semiconductor substrate, and are inserted between the output terminals of said counter and said semiconductor elements.

13. A current controlling device for a d.c. motor, wherein the current controlling device includes a power semiconductor device comprising:
a plurality of semiconductor elements which are electrically connected in parallel;
an input and an output terminal for respectively commonly connecting input and output parts of these semiconductor elements, said plurality of semiconductor elements being divided into a plurality of groups;
a plurality of control terminals for each commonly connecting control terminals of the semiconductor elements forming one group; and
counters having output terminals connected to said plurality of control terminals, respectively, said counters including means for counting an input control pulse and outputting on said output terminals output signals in accordance with the counts thereof.

14. A current controlling device according to claim 13, wherein said plurality of semiconductor elements are formed on a same semiconductor substrate.

15. A current controlling device according to claim 13, wherein said counters are further formed on the same semiconductor substrate.

16. A current controlling device according to claim 13, wherein memory circuits are formed on said semiconductor substrate, and are inserted between the output terminals of said counter and said semiconductor elements.

* * * * *